(12) United States Patent
Feng et al.

(10) Patent No.: US 11,107,946 B2
(45) Date of Patent: Aug. 31, 2021

(54) METHOD OF TRANSFERRING MICRO-LEDS FROM A GALLIUM ARSENIDE SUBSTRATE

(71) Applicant: Goertek Inc., Shandong Province (CN)

(72) Inventors: Xiangxu Feng, Shandong Province (CN); Peixuan Chen, Shandong Province (CN); Quanbo Zou, Shandong Province (CN)

(73) Assignee: Goertek Inc., Shandong Province (CN)

( * ) Notice: Subject to any disclaimer, the term of this patent is extended or adjusted under 35 U.S.C. 154(b) by 360 days.

(21) Appl. No.: 16/088,564

(22) PCT Filed: Dec. 19, 2017

(86) PCT No.: PCT/CN2017/117237
§ 371 (c)(1),
(2) Date: Sep. 26, 2018

(87) PCT Pub. No.: WO2019/109390
PCT Pub. Date: Jun. 13, 2019

(65) Prior Publication Data
US 2021/0013368 A1    Jan. 14, 2021

(30) Foreign Application Priority Data
Dec. 4, 2017   (CN) .......................... 201711259921.X

(51) Int. Cl.
*H01L 21/00*   (2006.01)
*H01L 33/00*   (2010.01)
*H01L 33/62*   (2010.01)

(52) U.S. Cl.
CPC ...... *H01L 33/0093* (2020.05); *H01L 33/0062* (2013.01); *H01L 33/62* (2013.01); *H01L 2933/0066* (2013.01)

(58) Field of Classification Search
CPC . H01L 33/0093; H01L 33/0062; H01L 33/62; H01L 2933/0066
See application file for complete search history.

(56) References Cited

U.S. PATENT DOCUMENTS

| 10,020,212 | B1* | 7/2018 | Pourchet | ............. | H01L 33/0093 |
| 2010/0144073 | A1* | 6/2010 | Louwsma | ............. | H01L 27/156 438/28 |

(Continued)

FOREIGN PATENT DOCUMENTS

| CN | 104584110 A | 4/2015 |
| CN | 106653962 A | 5/2017 |
| CN | 107017319 A | 8/2017 |

OTHER PUBLICATIONS

International Searching Authority, International Search Report and Written Opinion for Application No. PCT/CN2017/117237, dated Sep. 5, 2018, 10 pages, State Intellectual Property Office of the P.R.C., China.

*Primary Examiner* — Ismail A Muse
(74) *Attorney, Agent, or Firm* — Alston & Bird LLP

(57) ABSTRACT

The present disclosure discloses a micro-LED transfer method, a manufacturing method, device and an electronic apparatus. The transfer method comprises: in accordance with a sequence of micro-LEDs of blue, green and red, epitaxially growing micro-LEDs of two or all of the three colors on a single GaAs original substrate; epitaxially growing bumping electrodes corresponding to the micro-LEDs on a receiving substrate; bonding the micro-LEDs of the two or all of the three colors with the bumping electrodes on the receiving substrate; and removing the GaAs original substrate. The method can be used to transfer micro-LEDs of a variety of colors, in order to improve the production efficiency.

9 Claims, 4 Drawing Sheets

(56) References Cited

U.S. PATENT DOCUMENTS

| | | | |
|---|---|---|---|
| 2012/0228657 A1* | 9/2012 | Nakamura | H01L 27/3225 |
| | | | 257/98 |
| 2014/0225136 A1 | 8/2014 | Kim et al. | |
| 2015/0221619 A1 | 8/2015 | Rhee | |
| 2016/0351747 A1* | 12/2016 | Forrest | H01L 31/0687 |
| 2017/0062683 A1* | 3/2017 | Chen | H01L 33/405 |
| 2018/0102443 A1* | 4/2018 | Kayes | H01L 31/18 |
| 2018/0277524 A1* | 9/2018 | Moon | H01L 33/22 |
| 2019/0006558 A1* | 1/2019 | Watanabe | H01L 33/36 |
| 2019/0027075 A1* | 1/2019 | Hughes | G09G 3/006 |

\* cited by examiner

METHOD OF TRANSFERRING MICRO-LEDS FROM A GALLIUM ARSENIDE SUBSTRATE

CROSS-REFERENCE TO RELATED APPLICATIONS

This application is a National Stage of International Application No. PCT/CN2017/117237, filed on Dec. 19, 2017, which claims priority to Chinese Patent Application No. 201711259921.X, filed on Dec. 4, 2017, both of which are hereby incorporated by reference in their entireties.

BACKGROUND

Technical Field

The present disclosure relates to micro-LEDs, and more particularly to a micro-LED transfer method, a micro-LED manufacturing method, a micro-LED device and an electronic apparatus comprising the micro-LED device.

Related Art

The micro-LED technology refers to the LED array of small size integrated on a substrate with high density. Due to the differences between materials and process conditions for forming micro-LEDs of blue, green and red, there is a need to form and transfer the micro-LEDs of the three colors respectively. The transfer efficiency is limited.

BRIEF SUMMARY

One object of this disclosure is to provide a new technical solution for micro-LED transfer, in order to transfer micro-LEDs of a variety of colors in one pass.

According to a first aspect of the present disclosure, there is provided a micro-LED transfer method, comprising: in accordance with a sequence of micro-LEDs of blue, green and red, epitaxially growing micro-LEDs of two or all of the three colors on corresponding selected areas of a single GaAs original substrate, and then fabricating metal electrodes; epitaxially growing bumping electrodes corresponding to the micro-LEDs on a receiving substrate; bonding metal electrodes of the micro-LEDs of the two or all of the three colors with the bumping electrodes on the receiving substrate; and removing the GaAs original substrate.

Preferably, removing the original substrate comprises: removing the GaAs original substrate by means of wet etching.

Preferably, epitaxially growing micro-LEDs of two or all of the three colors on a GaAs original substrate comprises: epitaxially growing a layer of InGaAs on the GaAs original substrate, and then epitaxially growing the micro-LEDs of the two or all of the three colors on the layer of InGaAs; and removing the GaAs original substrate comprises: removing the GaAs original substrate by means of laser lifting-off.

Preferably, the melting point of the bumping electrodes is lower than or equal to 350° C.

Preferably, epitaxially growing micro-LEDs of two or all of the three colors on a GaAs original substrate comprises: epitaxially growing the micro-LEDs of the two or all of the three colors on the (111) or (100) crystal face of the GaAs original substrate.

Preferably, at least blue micro-LEDs are epitaxially grown on the single GaAs original substrate, the blue micro-LEDs being epitaxially grown from the GaN material; or at least green micro-LEDs are epitaxially grown on the single GaAs original substrate, the green micro-LED being epitaxially grown from the GaN material; or at least red micro-LEDs are epitaxially grown on the single GaAs original substrate, the red micro-LED being epitaxially grown from the GaAs material.

Preferably, N-electrodes and P-electrodes of the micro-LEDs are located at the same side, with each of the micro-LEDs corresponding to two of the bumping electrodes on the receiving substrate; or N-electrodes and P-electrodes of the micro-LEDs are located at opposed sides, with each of the micro-LEDs corresponding to one of the bumping electrodes on the receiving substrate.

Preferably, epitaxially growing micro-LEDs of two or all of the three colors on corresponding selected areas of a single GaAs original substrate comprises: providing a mask on corresponding areas of the single GaAs original substrate not required for epitaxially growing blue micro-LEDs, and then epitaxially growing the blue micro-LEDs on areas not covered by the mask; or providing a mask on corresponding areas of the single GaAs original substrate not required for epitaxially grow green micro-LEDs, and then epitaxially growing the green micro-LEDs on areas not covered by the mask; or providing masks on corresponding areas of the single GaAs original substrate not required for epitaxially grow red micro-LEDs, and then epitaxially growing the red micro-LEDs on areas not covered by the mask.

According to a second aspect of the present disclosure, there is provided a manufacturing method for manufacturing a micro-LED device, comprising transferring micro-LEDs to a receiving substrate by using the above-mentioned method.

According to a third aspect of the present disclosure, there is provided a micro-LED device manufactured by using the above-mentioned manufacturing method.

According to a fourth aspect of the present disclosure, there is provided an electronic apparatus comprising the above-mentioned micro-LED device.

The inventor of the present disclosure has found that it is possible to in accordance with a sequence of the micro-LEDs of blue, green and red, epitaxially grow the micro-LEDs of the two or all of the three colors on the same single GaAs original substrate. Based on this, it is possible to transfer the micro-LEDs of different colors to the receiving substrate in one pass.

The inventor of the present disclosure has found that in prior art no technical solution is used to transfer micro-LEDs of a variety of colors in one pass. Therefore, the technical mission to be achieved or the technical problem to be solved in the present disclosure is unintentional or unanticipated to the skilled in the art, and thus the present disclosure refers to a novel technical solution.

Further features of the present disclosure and advantages thereof will become apparent from the following detailed description of exemplary embodiments according to the present disclosure with reference to the attached drawings.

BRIEF DESCRIPTION OF THE FIGURES

The accompanying drawings, which are incorporated in and constitute a part of the specification, illustrate embodiments of the disclosure and, together with the description thereof, serve to explain the principles of the disclosure.

DETAILED DESCRIPTION OF THE VARIOUS EMBODIMENTS

Figure 1:
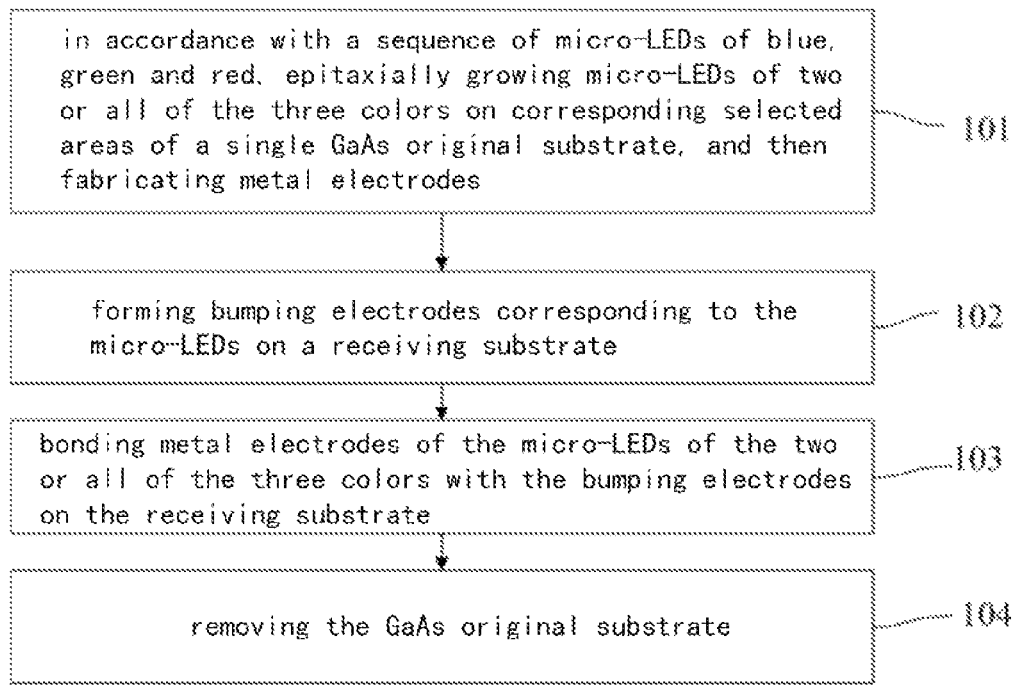
FIG. 1 shows a flow chart of a micro-LED transfer method provided in an embodiment of the present disclosure.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

The following description of at least one exemplary embodiment is merely illustrative in nature and is in no way intended to limit the disclosure, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

It is to be noted that embodiments of the present disclosure, in which micro-LEDs of blue, green and red colors are epitaxially grown on the same single GaAs original substrate and the micro-LEDs of these three colors are transferred to a receiving substrate in one pass, is used as an example to illustrate a micro-LED transfer method. Also, the method is suitable for transferring micro-LEDs of two of all of the three colors in one pass. Since the principle is identical, the description to it is omitted.

Referring to FIG. 1, a micro-LED transfer method provided in an embodiment of the present disclosure comprises the following steps.

Step 101: In accordance with a sequence of micro-LEDs of blue, green and red, epitaxially growing the micro-LEDs of two or all of the three colors on corresponding selected areas of a single GaAs original substrate, and then fabricating metal electrodes.

GaAs is selected as material for the original substrate, since the (100) crystal face of GaAs is more suitable for fabricating the red micro-LEDs, while the (111) crystal face of GaAs is more suitable for fabricating the blue and green micro-LEDs. The inventor of this disclosure has found that it is possible to epitaxially grow the micro-LEDs of the different colors on the (100) or (111) crystal face of the GaAs original substrate.

Material for epitaxially growing the blue and green micro-LEDs is preferably GaN. Material for epitaxially growing the red micro-LEDs is preferably GaAs.

In particular, the step of epitaxially growing the blue micro-LEDs can comprise fabricating a mask pattern on the GaAs substrate in a way to expose areas of the substrate required for epitaxially growing the blue micro-LEDs, and then epitaxially growing the blue micro-LEDs on the exposed areas of the substrate by means of metal organic chemical vapor deposition (MOCVD), for instance. Next, the mask is removed.

After the completion of the epitaxial growth of the blue micro-LEDs, a mask pattern on the GaAs substrate is fabricated in a way to expose areas of the substrate required for epitaxially growing the green micro-LEDs, and then the green micro-LEDs are epitaxially grown on the exposed areas of the substrate by means of MOCVD, for instance. Next, the mask is removed.

After the completion of the epitaxial growth of the red micro-LEDs, a mask pattern on the GaAs substrate is fabricated in a way to expose areas of the substrate required for epitaxially growing the red micro-LEDs, and then the red micro-LEDs are epitaxially grown on the exposed areas of the substrate by means of MOCVD, for instance. Next, the mask is removed.

Particular processing steps for epitaxially growing the micro-LEDs can be carried out by a person skilled in the art in accordance with the prior arts and are not limited herein.

The reason for epitaxially growing the blue micro-LEDs in the first place is that the processing temperatures for epitaxially growing the blue micro-LEDs are about 850-860° C., while the processing temperatures for epitaxially growing the green micro-LEDs are about 820-830° C. The damage to the green micro-LEDs due to high temperatures can be avoided by epitaxially growing the blue micro-LEDs in the first place. The reason for epitaxially growing the red micro-LEDs in the end is that the processing temperatures for epitaxially growing the red micro-LEDs are about 500-600° C., which are the lowest.

After the completion of the epitaxial growth of the micro-LEDs of the three different colors, metal electrodes are fabricated on top surfaces of these micro-LEDs. A method for fabricating the metal electrodes can for instance comprise first growing a layer of metal film, and then removing areas of the metal film not required for fabricating the metal electrodes by means of masking and etching processes. Another method for fabricating the metal electrodes can for instance comprise first fabricating a mask pattern in a way to expose areas of the metal film required for fabricating the metal electrodes, and then depositing the metal electrodes and then removing the mask.

In an example, the above-mentioned micro-LEDs of a variety of colors are all lateral micro-LEDs, that is to say, N-electrodes and P-electrodes thereof are located at the same side of the micro-LEDs. After the completion of Step 101, the micro-LEDs with the N-electrodes and P-electrodes are formed simultaneously.

In another example, N-electrodes and P-electrodes of the above-mentioned micro-LEDs of a variety of colors are located at opposed sides of the micro-LEDs. After the completion of Step 101, the micro-LEDs with only one type of the electrodes are formed.

In an example, the micro-LEDs of the different colors are directly epitaxially grown on the GaAs original substrate.

In another example, a layer of InGaAs film is first epitaxially grown on the GaAs original substrate, and then the micro-LEDs of the different colors are epitaxially grown on the InGaAs layer. There is a need to improve the content of In element in the InGaAs film in a controlled way, such that the width of a bandgap of the InGaAs film is smaller than a predefined value, for instance 1.165 eV. If the width of the bandgap of the InGaAs film is smaller than 1.165 eV, the InGaAs film is opaque to a laser of 1064 nm. In the latter Step 104, the film can be used as a blocking layer for laser lifting-off.

Step 102: forming bumping electrodes corresponding to the micro-LEDs on a receiving substrate.

The receiving substrate can for instance be a backplane fabricated with a drive circuit for the micro-LEDs. A method for forming the bumping electrodes on the receiving substrate can for instance comprise a method such as photolithography, electron beam evaporation or thermal evaporation of electrode materials. The method thereof is not limited in this disclosure.

The bumping electrodes formed on the receiving substrate correspond to the metal electrodes of the micro-LEDs in Step 101.

Materials for the bumping electrodes are conductive materials of low melting point, the melting point of which should be lower than 350° C. In particular, materials for the bumping electrodes can for instance be one of bismuth (Bi), tin (Sn), lead (Pb) and indium (In) or an alloy with a combination of some of these metals.

Step 103: bonding the micro-LEDs of the two or all of the three colors with the bumping electrodes on the receiving substrate.

Take the bumping electrodes formed of In as an example, the melting point of In is 156.63° C., and the In electrodes are melted by heating, so as to bond with the metal electrodes of the micro-LEDs.

The temperature for bonding process cannot be too high, for instance higher than 500° C., so that the damage to the micro-LEDs and circuits can be avoided.

Step 104: removing the GaAs original substrate.

Regarding Step 101 in which the micro-LEDs with a variety of colors are epitaxially grown on the GaAs original substrate directly, a wet etching method can be used to dissolve the GaAs substrate. The speed of etching is controlled to remove the substrate while retaining the micro-LEDs. At the same time, a circuit structure on a side of the receiving substrate should be protected, and in particular metal circuits on the receiving substrate are protected from being etched.

Regarding Step 101 in which first epitaxially growing a layer of InGaAs film on the GaAs original substrate, and then epitaxially growing the micro-LEDs of the different colors on the layer of InGaAs, one side of the GaAs original substrate can be irradiated by a laser to lift-off the GaAs original substrate. Due to the presence of the layer of InGaAs, the micro-LEDs facing away from the one side of the laser by the layer of InGaAs cannot be irradiated by the laser.

The inventor of the present disclosure has found that it is possible to grow micro-LEDs with a variety of colors on a single original substrate by using the method comprising in accordance with a sequence of micro-LEDs of blue, green and red, epitaxially growing the micro-LEDs on corresponding selected areas of the single original substrate. The metal electrodes are fabricated on the micro-LEDs, the metal electrodes being used to bond with the bumping electrodes on the receiving substrate in the subsequent step. After the completion of the bonding of the metal electrodes of the micro-LEDs with the bumping electrodes of the receiving substrate, the GaAs original substrate is removed. It is possible to transfer the micro-LEDs of the different colors, even of the three colors to the receiving substrate in one pass. Therefore, the processing steps are reduced and the production efficiency is improved.

FIG. 2A-FIG. 2M show an example of the present disclosure for transferring micro-LEDs.

Figure 2A:
FIG. 2A-FIG. 2M show an example of the present disclosure for transferring micro-LEDs.

As shown in FIG. 2A, a mask pattern 202 is formed on a GaAs original substrate 201 in a way to expose areas of the GaAs original substrate required for fabricating blue micro-LEDs.

Figure 2B:
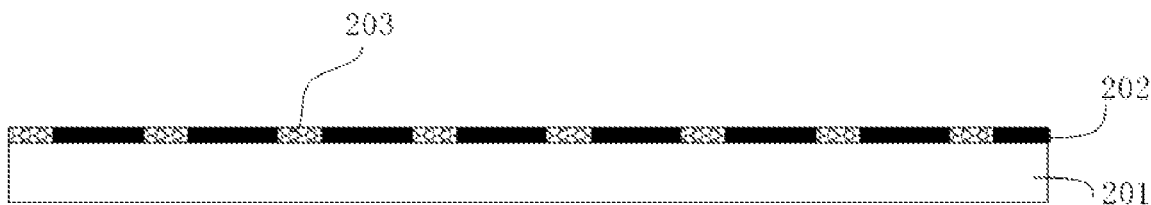

As shown in FIG. 2B, the blue micro-LEDs 203 are epitaxially grown on areas of the GaAs original substrate 201 not covered by the mask pattern 202. The blue micro-LEDs 203 for instance are micro-LEDs in a vertical configuration, comprising an n-type doped GaN layer, a plurality of quantum well structures, a p-type doped GaN layer, and so on. Alternatively, the blue micro-LEDs 203 for instance are micro-LEDs in a horizontal configuration, comprising an n-type doped GaN layer, a plurality of quantum well structures, a p-type doped GaN layer, and so on.

Figure 2C:
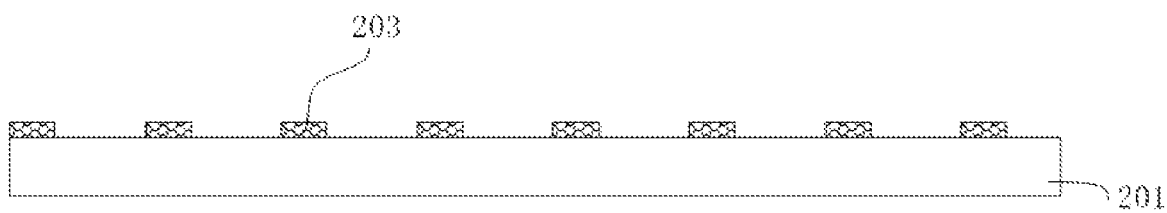
Figure 2D:
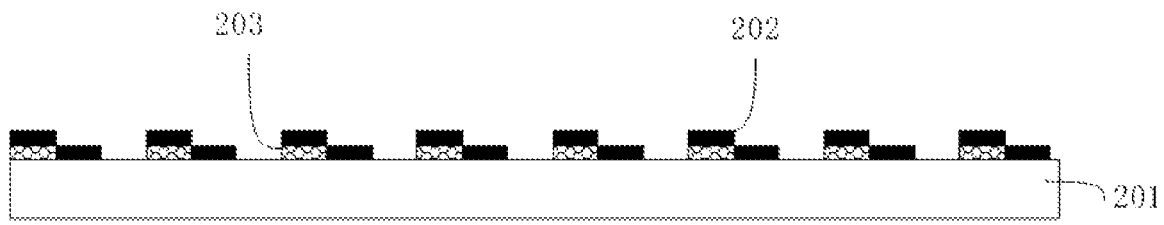

As shown in FIG. 2C, after removal of the mask pattern 202, the blue micro-LEDs 203 are retained on the GaAs original substrate 201.

As shown in FIG. 2D, again, a mask pattern 202 is formed in a way to expose areas of the GaAs original substrate required for fabricating the green micro-LEDs.

Figure 2E:
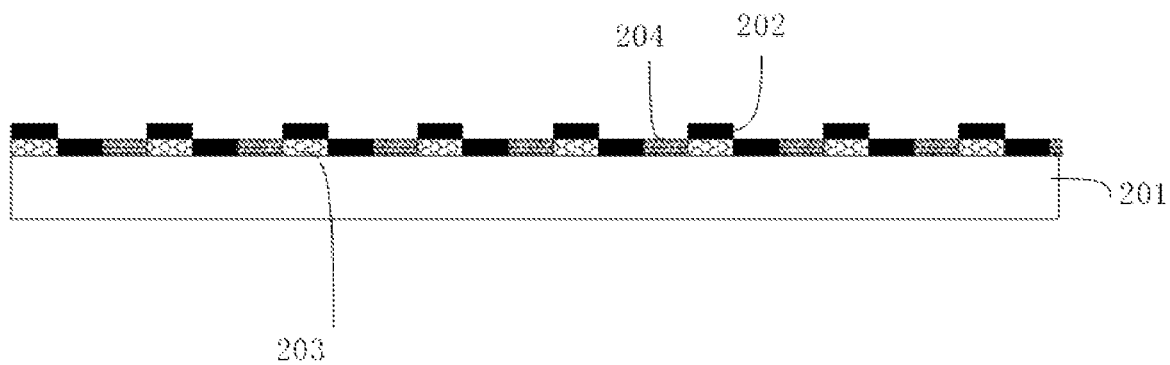

As shown in FIG. 2E, the green micro-LEDs 204 are epitaxially grown on areas of the GaAs original substrate 201 not covered by the mask pattern 202. The green micro-LEDs 204 for instance are micro-LEDs in a vertical configuration, comprising an n-type doped GaN layer, a plurality of quantum well structures, a p-type doped GaN layer, and so on. Alternatively, the green micro-LEDs 204 for instance are micro-LEDs in a horizontal configuration, comprising an n-type doped GaN layer, a plurality of quantum well structures, a p-type doped GaN layer, and so on.

Figure 2F:
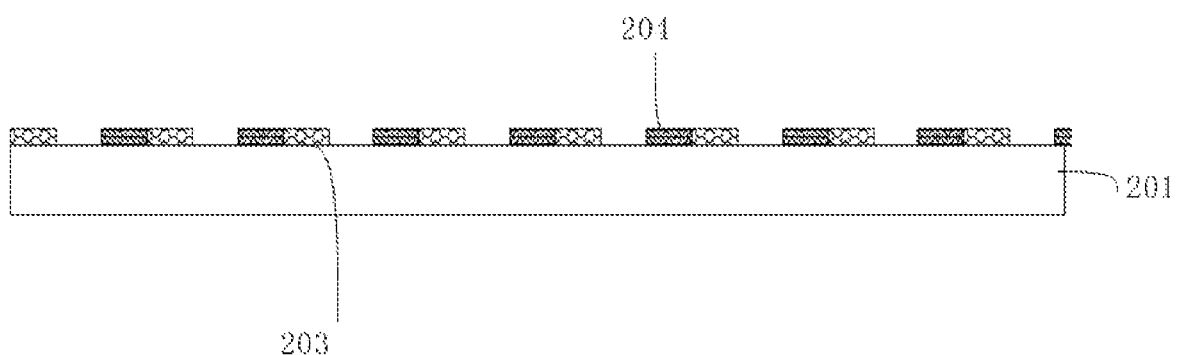
Figure 2G:
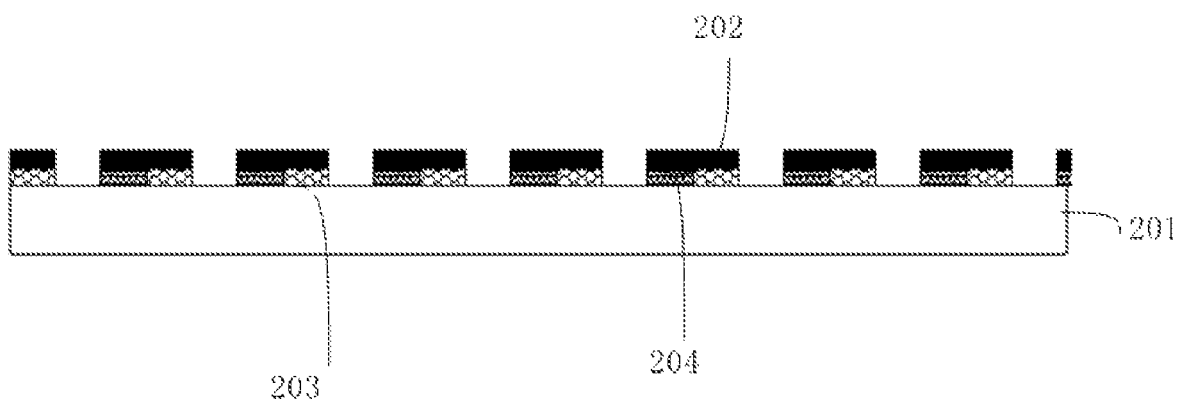

As shown in FIG. 2F, after removal of the mask pattern 202, the blue micro-LEDs 203 and the green micro-LEDs 204 are retained on the GaAs original substrate 201.

As shown in FIG. 2G again, a mask pattern 202 is formed in a way to expose areas of the GaAs original substrate required for fabricating the red micro-LEDs.

Figure 2H:
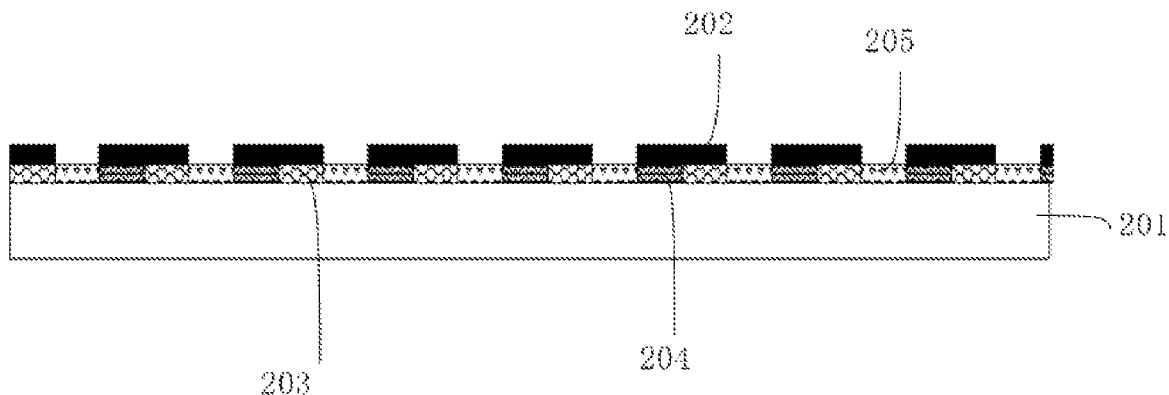

As shown in FIG. 2H, the red micro-LEDs 205 are epitaxially grown on areas of the GaAs original substrate 201 not covered by a mask pattern 202. The red micro-LEDs 205 for instance are micro-LEDs in a vertical configuration, comprising an n-type doped GaAs layer, a plurality of quantum well structures, a p-type doped GaAs layer, and so on. Alternatively, the red micro-LEDs 205 for instance are micro-LEDs in a horizontal configuration, comprising an n-type doped GaAs layer, a plurality of quantum well structures, a p-type doped GaAs layer, and so on.

Figure 2I:
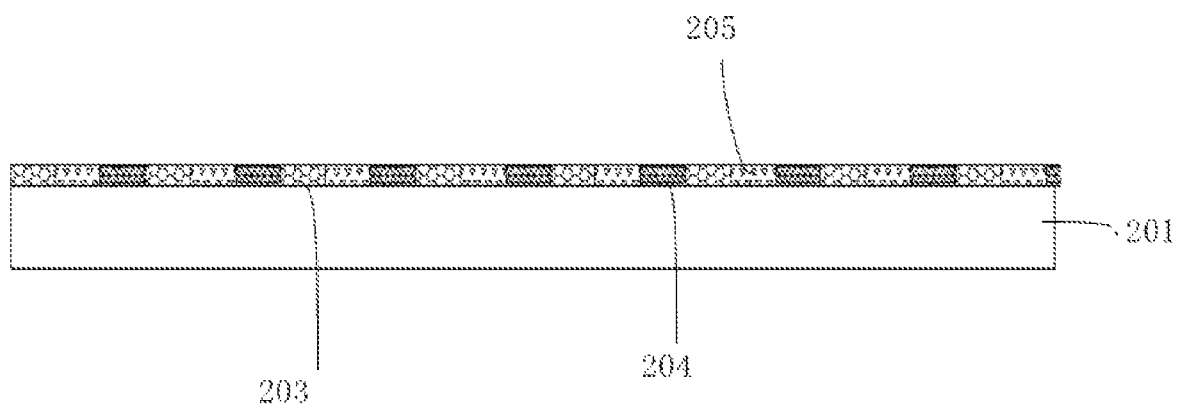

As shown in FIG. 2I, after removal of the mask pattern 202, the blue micro-LEDs 203, the green micro-LEDs 204 and the red micro-LEDs 205 are retained on the GaAs original substrate 201.

Figure 2J:
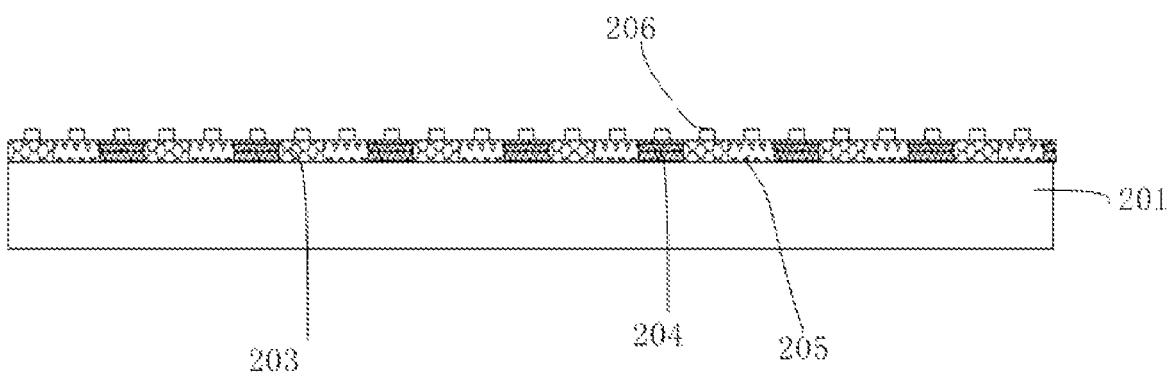

As shown in FIG. 2J, metal electrodes 206 are formed on the blue micro-LEDs 203, the green micro-LEDs 204 and the red micro-LEDs 205. FIG. 2J shows an example of the corresponding vertical micro-LEDs, in which one metal electrode (for instance one p metal electrode) is formed on each of the micro-LEDs. It is easy for a person skilled in the art to devise that regarding the horizontal micro-LEDs, two metal electrodes comprising one n metal electrode and one p metal electrode are formed on each of the micro-LEDs.

Figure 2K:
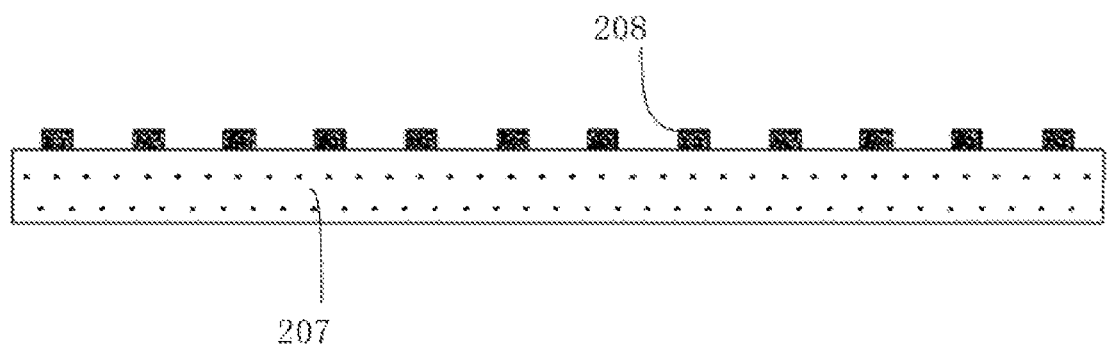

As shown in FIG. 2K, bumping electrodes 208 are formed on a receiving substrate 207, for instance a backplane fabricated with a drive circuit for the micro-LEDs, at locations corresponding to the micro-LEDs to be transferred.

Figure 2L:
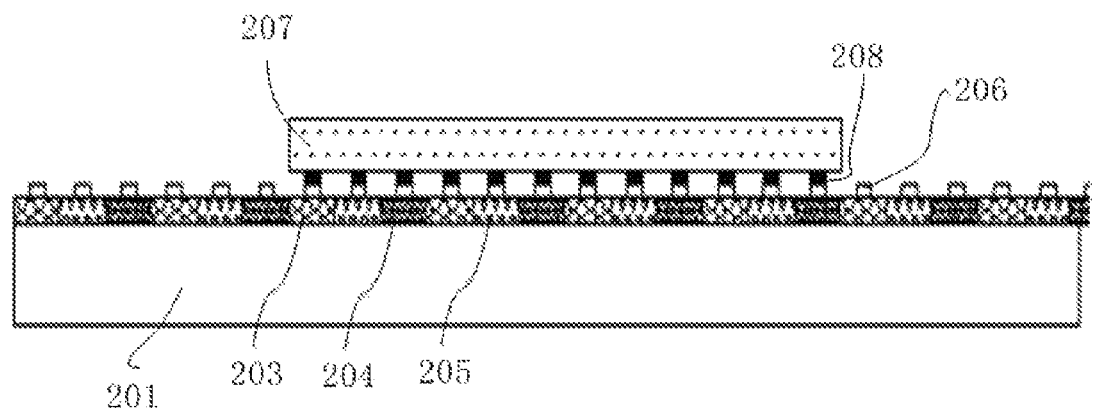

As shown in FIG. 2L, the bumping electrodes 208 of the receiving substrate 207 are aligned with the metal electrodes 206 of the blue, green and red micro-LEDs 203, 204, 205 on the GaAs original substrate 201, the bumping electrodes and the metal electrodes are bonded by the high temperature effect. In order to improve the production efficiency, the actual GaAs original substrate 201 may have the area that is several times of the area of the receiving substrate 207. In this case, a laser lifting-off method is suitable for removing the GaAs original substrate. Alternatively, the actual GaAs original substrate 201 can have an area equal to that of the receiving substrate 307. In this case, the laser lifting-off method and a wet etching method are both suitable for removing the GaAs original substrate.

Figure 2M:
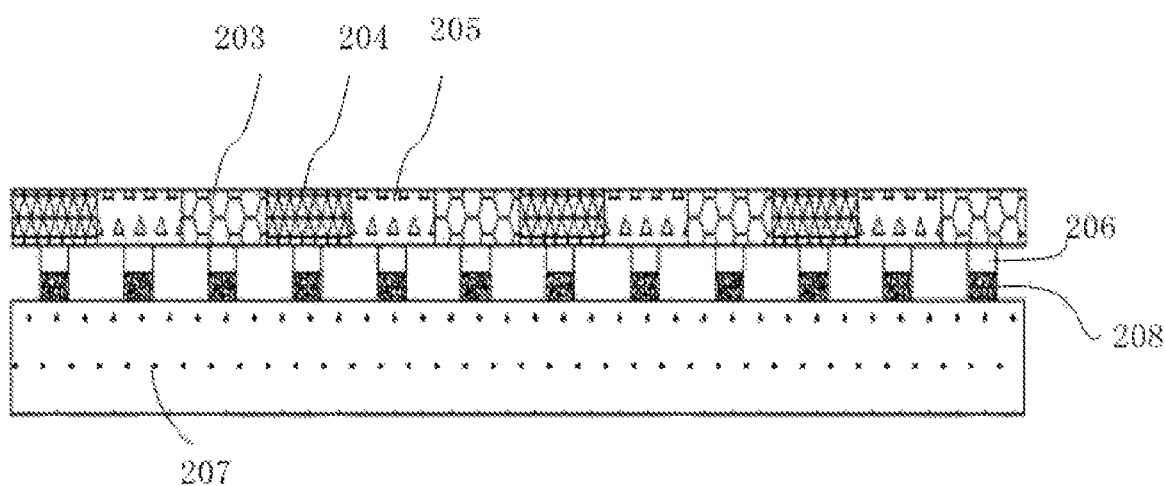

As shown in FIG. 2M, after removal of the GaAs original substrate 201, the blue, green and red micro-LEDs 203, 204, 205 are transferred to the receiving substrate 207 in one pass.

Based on the micro-LED transfer method provided by the above-mentioned embodiment, the present disclosure further provides a manufacturing method for manufacturing a micro-LED device.

For instance, after the completion of the transfer of the vertical micro-LEDs, the other type of electrodes of the vertical micro-LEDs is fabricated, and so on.

For instance, after the completion of the transfer of the horizontal micro-LEDs, a subsequent packaging process is performed, and so on.

The present disclosure further provides a micro-LED device, for instance a micro-LED display module and the like, manufactured by the above-mentioned manufacturing method for manufacturing a micro-LED device.

The present disclosure further provides an electronic apparatus which comprises the above-mentioned micro-LED device.

Although some specific embodiments of the present disclosure have been demonstrated in detail with examples, it should be understood by a person skilled in the art that the above examples are only intended to be illustrative but not to limit the scope of the present disclosure. It should be understood by those skilled in the art that the above embodiments could be modified without departing from the scope and spirit of the present disclosure. The scope of the present disclosure is defined by the appended claims.

What is claimed is:

1. A micro-LED transfer method, comprising:
    in accordance with a sequence of micro-LEDs of blue, green and red, epitaxially growing micro-LEDs of two or all of the three colors on corresponding selected areas of a single GaAs original substrate, and then fabricating metal electrodes;
    forming bumping electrodes corresponding to the micro-LEDs on a receiving substrate;
    bonding metal electrodes of the micro-LEDs of the two or all of the three colors with the bumping electrodes on the receiving substrate; and
    removing the GaAs original substrate,
    wherein, epitaxially growing micro-LEDs of two or all of the three colors on a GaAs original substrate comprises:
    epitaxially growing a layer of InGaAs on the GaAs original substrate, and then epitaxially growing the micro-LEDs of the two or all of the three colors on the layer of InGaAs,
    wherein, epitaxially growing micro-LEDs of two or all of the three colors on corresponding selected areas of a single GaAs original substrate comprises:
    providing a mask on corresponding areas of the single GaAs original substrate not required for epitaxially growing blue micro-LEDs, and then epitaxially growing the blue micro-LEDs on areas not covered by the mask; or
    providing a mask on corresponding areas of the single GaAs original substrate not required for epitaxially grow green micro-LEDs, and then epitaxially growing the green micro-LEDs on areas not covered by the mask; or
    providing masks on corresponding areas of the single GaAs original substrate not required for epitaxially grow red micro-LEDs, and then epitaxially growing the red micro-LEDs on areas not covered by the mask.

2. The method according to claim 1, wherein, removing the original substrate comprises: removing the GaAs original substrate by means of wet etching.

3. The method according to claim 1, wherein,
    removing the GaAs original substrate comprises: removing the GaAs original substrate by means of laser lifting-off.

4. The method according to claim 1, wherein, the melting point of the
    bumping electrodes is lower than or equal to 350° C.

5. The method according to claim 1, wherein, epitaxially growing micro-LEDs of two or all of the three colors on a GaAs original substrate comprises: epitaxially growing the micro-LEDs of the two or all of the three colors on the (111) or (100) crystal face of the GaAs original substrate.

6. The method according to claim 1, wherein, at least blue micro-LEDs are epitaxially grown on the single GaAs original substrate, the blue micro-LEDs being epitaxially grown from a GaN material; or
    at least green micro-LEDs are epitaxially grown on the single GaAs original substrate, the green micro-LED being epitaxially grown from the GaN material; or
    at least red micro-LEDs are epitaxially grown on the single GaAs original substrate, the red micro-LED being epitaxially grown from the GaAs material.

7. The method according to claim 1, wherein, N-electrodes and P-electrodes of the micro-LEDs are located at the same side, with each of the micro-LEDs corresponding to two of the bumping electrodes on the receiving substrate; or
    N-electrodes and P-electrodes of the micro-LEDs are located at opposed sides, with each of the micro-LEDs corresponding to one of the bumping electrodes on the receiving substrate.

8. A manufacturing method for manufacturing a micro-LED device, comprising transferring micro-LEDs to a receiving substrate by using the method according to claim 1.

9. A micro-LED device manufactured by using the manufacturing method according to claim 8.

* * * * *